United States Patent
Luan

(10) Patent No.: US 12,519,046 B2
(45) Date of Patent: Jan. 6, 2026

(54) WAFER LEVEL PACKAGING HAVING REDISTRIBUTION LAYER FORMED UTILIZING LASER DIRECT STRUCTURING

(71) Applicant: STMicroelectronics Pte Ltd, Singapore (SG)

(72) Inventor: Jing-En Luan, Singapore (SG)

(73) Assignee: STMicroelectronics Pte Ltd, Singapore (SG)

(*) Notice: Subject to any disclaimer, the term of this patent is extended or adjusted under 35 U.S.C. 154(b) by 857 days.

(21) Appl. No.: 17/677,505

(22) Filed: Feb. 22, 2022

(65) Prior Publication Data

US 2022/0285256 A1 Sep. 8, 2022

Related U.S. Application Data

(60) Provisional application No. 63/155,400, filed on Mar. 2, 2021.

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4857* (2013.01); *H01L 21/561* (2013.01);
(Continued)

(58) Field of Classification Search
CPC ... H01L 21/4857; H01L 21/56; H01L 21/561; H01L 21/568; H01L 21/6835;
(Continued)

(56) References Cited

U.S. PATENT DOCUMENTS 7,208,345 B2  4/2007  Meyer et al.
8,632,874 B2  1/2014  Paul et al.
(Continued)

FOREIGN PATENT DOCUMENTS

CN  102348324 A  2/2012
CN  102768961 A  11/2012
(Continued)

OTHER PUBLICATIONS

"Fan-Out Wars Begin," Semiconductor Engineering, https://semiengineering.com/fan-out-wars-begin/, 22 pages, Feb. 5, 2018.
(Continued)

*Primary Examiner* — Duy T Nguyen
*Assistant Examiner* — Jiyoung Oh
(74) *Attorney, Agent, or Firm* — Crowe & Dunlevy LLC

(57) ABSTRACT

A method of forming a wafer-level package includes singulating a wafer into a plurality of reconstituted integrated circuit dies, affixing a carrier to a front side of the plurality of integrated circuit dies, and forming a laser direct structuring (LDS) activatable resin over a back side of the plurality of integrated circuit dies, over side edges of the plurality of integrated circuit die, and over adjacent portions of the carrier. Desired areas of the LDS activatable resin are activated to form conductive areas within the LDS activatable resin, at least one of the conductive areas associated with each integrated circuit die being formed to contact a respective pad of that integrated circuit die and to run alongside to and in contact with a side of the LDS activatable resin in contact with a side edge of that integrated circuit die.

24 Claims, 12 Drawing Sheets

(51) Int. Cl.
*H01L 21/56* (2006.01)
*H01L 23/00* (2006.01)
*H01L 23/31* (2006.01)

(52) U.S. Cl.
CPC ...... *H01L 23/3128* (2013.01); *H01L 23/3171* (2013.01); *H01L 23/49816* (2013.01); *H01L 24/97* (2013.01)

(58) Field of Classification Search
CPC ............. H01L 23/3128; H01L 23/3135; H01L 23/3171; H01L 23/49816; H01L 23/49822; H01L 23/49866; H01L 23/5389; H01L 24/02; H01L 24/11; H01L 24/13; H01L 24/19; H01L 24/20; H01L 24/96; H01L 24/97; H01L 25/16; H01L 2224/02373; H01L 2224/02379; H01L 2224/02381; H01L 2224/111; H01L 2224/13008; H01L 2221/68327; H01L 2221/6834; H01L 2221/68345; H01L 2221/68372
USPC .......................................................... 257/723
See application file for complete search history.

(56) References Cited

U.S. PATENT DOCUMENTS

| | | | |
|---|---|---|---|
| 8,659,174 B2 | 2/2014 | Miyata et al. | |
| 8,778,733 B2 | 7/2014 | Fuergut et al. | |
| 9,177,884 B2 | 11/2015 | Schunk | |
| 9,330,994 B2 | 5/2016 | Camacho et al. | |
| 9,368,563 B2 | 6/2016 | Lin et al. | |
| 9,397,050 B2 | 7/2016 | Shin et al. | |
| 9,401,331 B2 | 7/2016 | Lin et al. | |
| 9,431,331 B2 | 8/2016 | Do et al. | |
| 9,502,397 B1 | 11/2016 | Scanlan | |
| 9,530,757 B2 | 12/2016 | Yu et al. | |
| 10,128,194 B1 | 11/2018 | Hiner et al. | |
| 10,170,385 B2 | 1/2019 | Lin et al. | |
| 10,217,702 B2 | 2/2019 | Lin et al. | |
| 10,292,258 B2 | 5/2019 | Hoang et al. | |
| 10,304,817 B2 | 5/2019 | Lin et al. | |
| 10,388,584 B2 | 8/2019 | Pagaila et al. | |
| 10,504,826 B1 | 12/2019 | Fillion et al. | |
| 10,504,827 B2 | 12/2019 | Baloglu et al. | |
| 10,510,703 B2 | 12/2019 | Chi et al. | |
| 10,692,737 B2 | 6/2020 | Fillion et al. | |
| 10,707,150 B2 | 7/2020 | Shim et al. | |
| 10,784,232 B2 | 9/2020 | Hiner et al. | |
| 2010/0193950 A1 | 8/2010 | Lee et al. | |
| 2011/0291274 A1 | 12/2011 | Meyer et al. | |
| 2012/0326307 A1 | 12/2012 | Jeong et al. | |
| 2015/0279815 A1 | 10/2015 | Do et al. | |
| 2016/0005628 A1* | 1/2016 | Yap | H01L 23/13 438/109 |
| 2017/0367182 A1* | 12/2017 | Wu | C09D 4/00 |
| 2018/0096975 A1 | 4/2018 | Hua et al. | |
| 2019/0139901 A1* | 5/2019 | Scanlan | H01L 21/565 |
| 2019/0259629 A1* | 8/2019 | Ziglioli | H01L 21/4821 |
| 2019/0333809 A1* | 10/2019 | Kim | H01L 24/03 |
| 2019/0371781 A1* | 12/2019 | Huang | H01L 23/5383 |
| 2020/0045827 A1* | 2/2020 | Choi | H05K 3/0026 |
| 2020/0211988 A1 | 7/2020 | Jahja et al. | |
| 2020/0402941 A1 | 12/2020 | Olson et al. | |

FOREIGN PATENT DOCUMENTS

| | | |
|---|---|---|
| CN | 103441111 A | 12/2013 |
| CN | 104332456 A | 2/2015 |
| CN | 107256847 A | 10/2017 |
| CN | 110379780 A | 10/2019 |
| CN | 111312686 A | 6/2020 |
| CN | 111477587 A | 7/2020 |
| CN | 111477588 A | 7/2020 |
| CN | 211788996 U | 10/2020 |
| CN | 112397397 A | 2/2021 |
| CN | 221125888 U | 6/2024 |
| KR | 101607989 B1 | 3/2016 |
| WO | 02074027 A1 | 9/2002 |
| WO | 2015153296 A1 | 10/2015 |
| WO | 2020038554 A1 | 2/2020 |

OTHER PUBLICATIONS

"Three-dimensional circuits with LDS Laser Direct Structuring and Metallization for 3D Mechatronic Integrated Devices," LaserMicronics Micromachining Services, https://www.lasermicronics.com/_mediafiles/80-lds-technology-for- moulded-interconnect-devices.pdf, date unknown.

"Wafer Level Fan-out (WLFO) Low Density Fan-out (LDFO)," Data Sheet, Wafer Level Produts, AMKOR Technology, Aug. 2019.

"Wafer-level chip-scale package (fan-in WLP and fan-out WLP)," AN10439, Rev. Jul. 8-10, 2018, Application Note.

Chou, Min-Chieh, et al: "Novel Laser Induced Metallization for Three Dimensional Molded Interconnect Device Applications by Spray Method," Advanced Materials Research vol. 1038 (2014) pp. 69-73.

Fan, Xuejun, "Wafer Level Packaging (WLP): Fan-in, Fan-out and Three-Dimensional Integration," 11th Int. Conf. on Thermal, Mechanical and Multiphysics Simulation and Experiments in Micro-Electronics and Micro-Systems, EuroSimE 2010.

Huemoeller, Ron: "Amkor's Slim & Swift Package Technology, SVP Advanced Package Technology Develop & IP," Amkor Technology, May 2015.

Lau, John H.: "Recent Advances and Trends in Fan-Out Wafer/Panel-Level Packaging," Journal of Electronic Packaging, Copyright 2019 by ASME, Dec. 2019, vol. 141.

Rahim, Kaysar, et al: "A Review on Laser Processing in Electronic and MEMS Packaging," Journal of Electronic Packaging, Dec. 25, 2016.

CN First Office Action and Search Report for counterpart CN Appl. No. 202210195634.1, report dated Jun. 27, 2025, 19 pgs.

\* cited by examiner

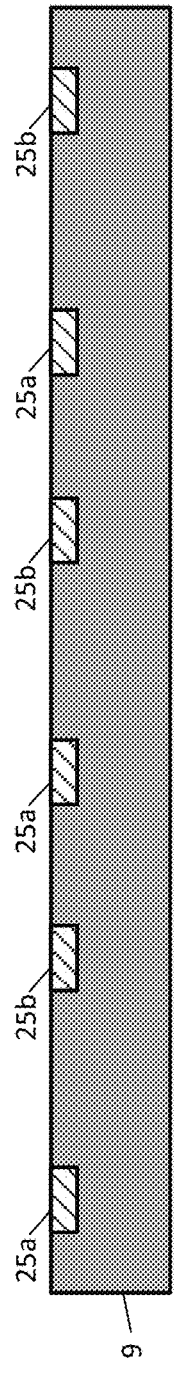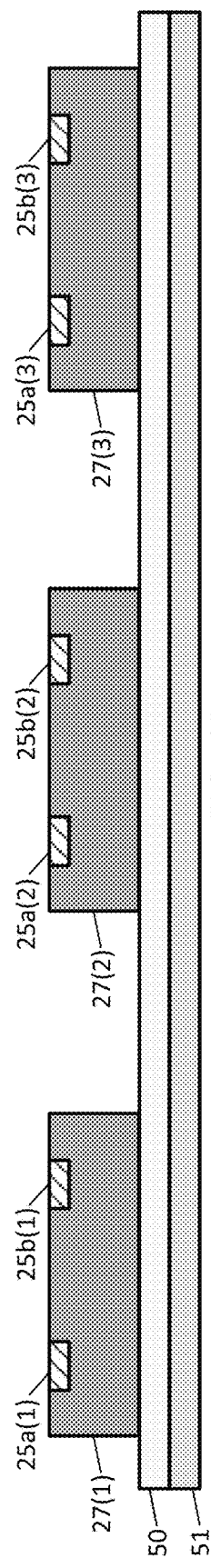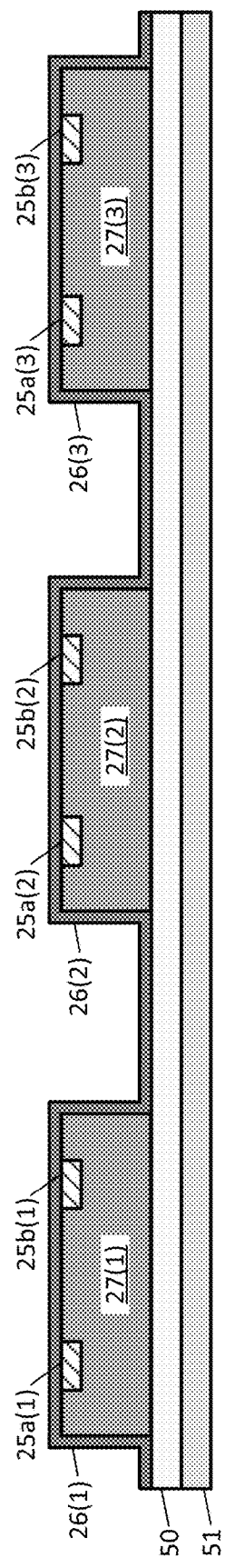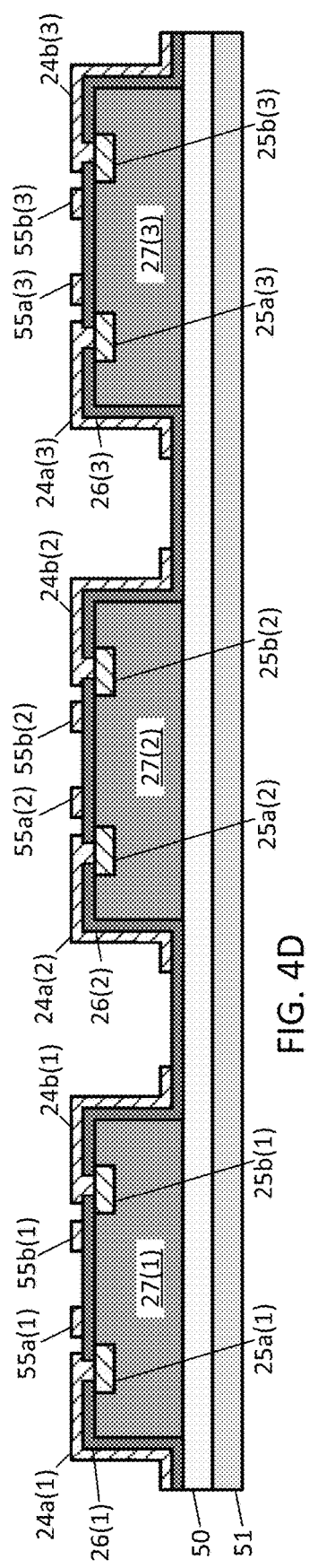

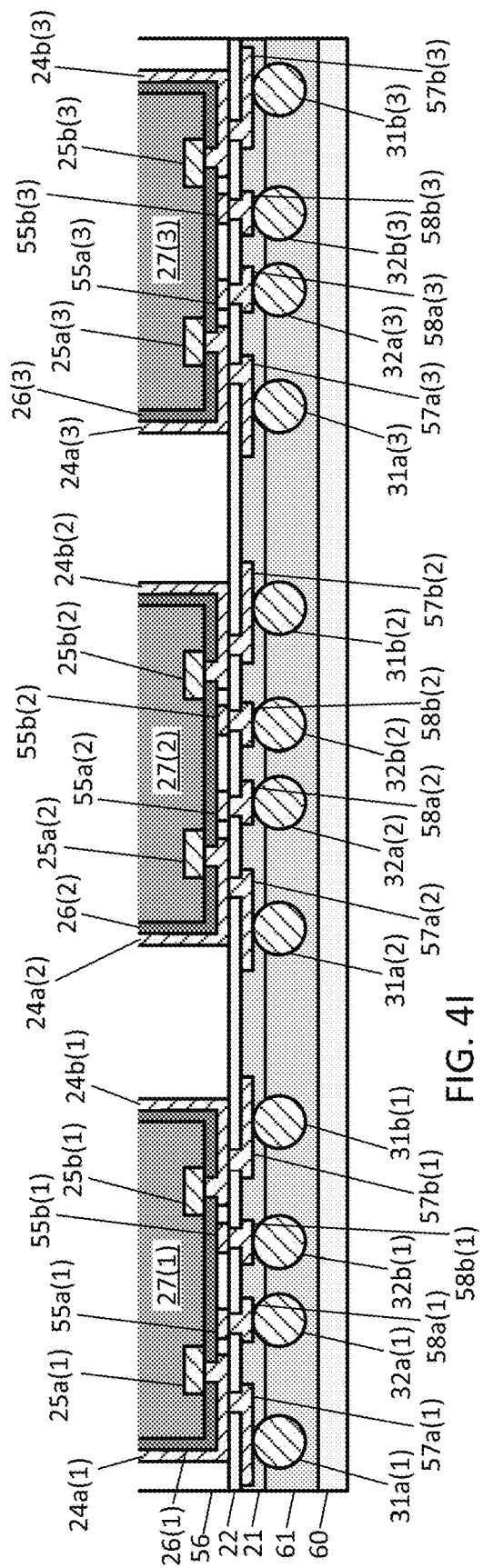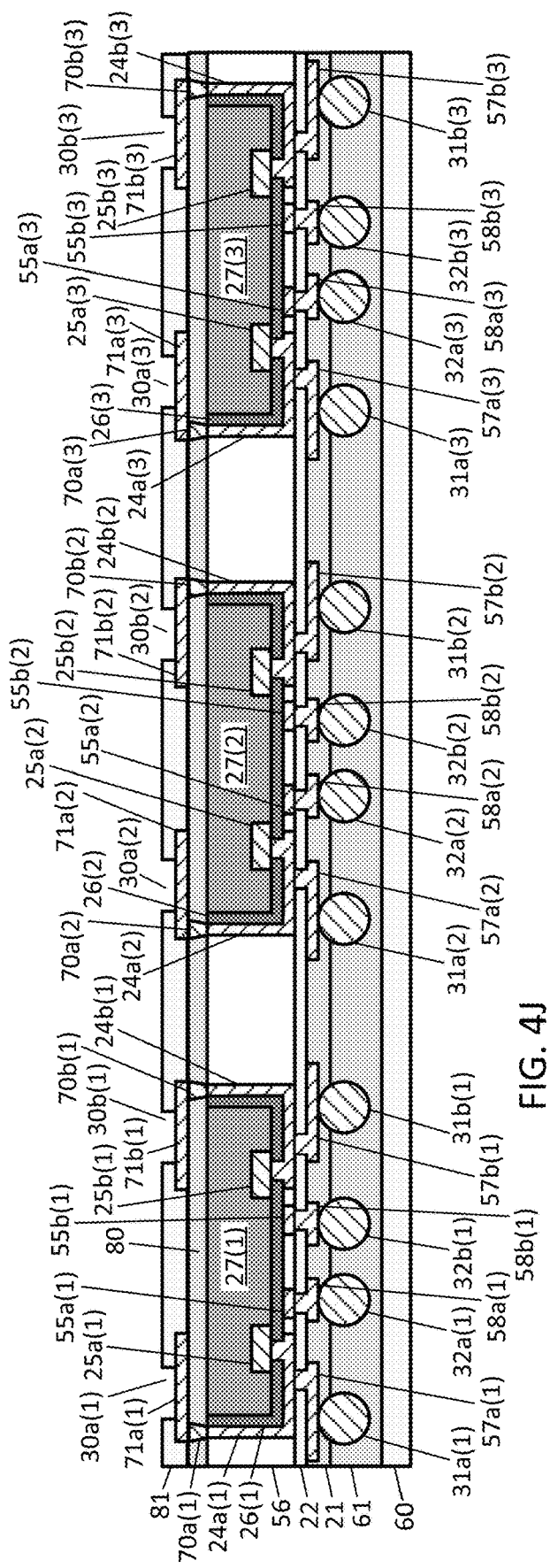

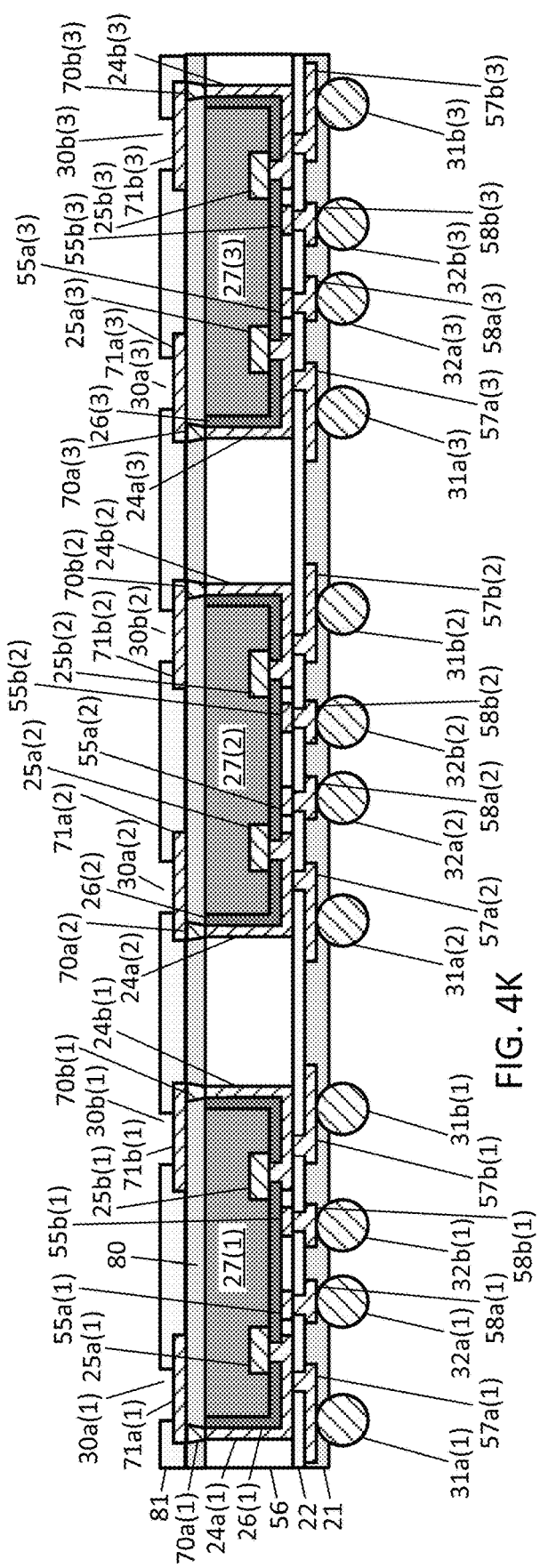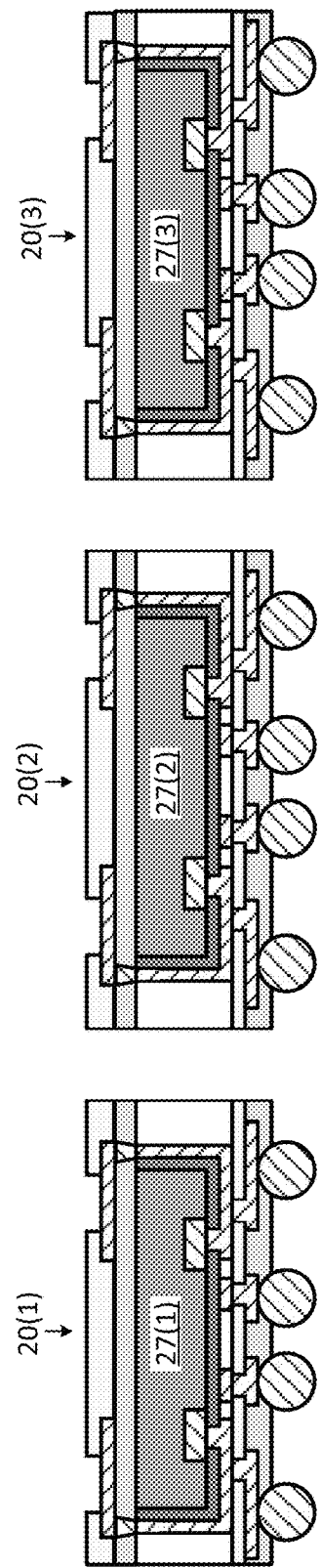
FIG. 4K
FIG. 4L

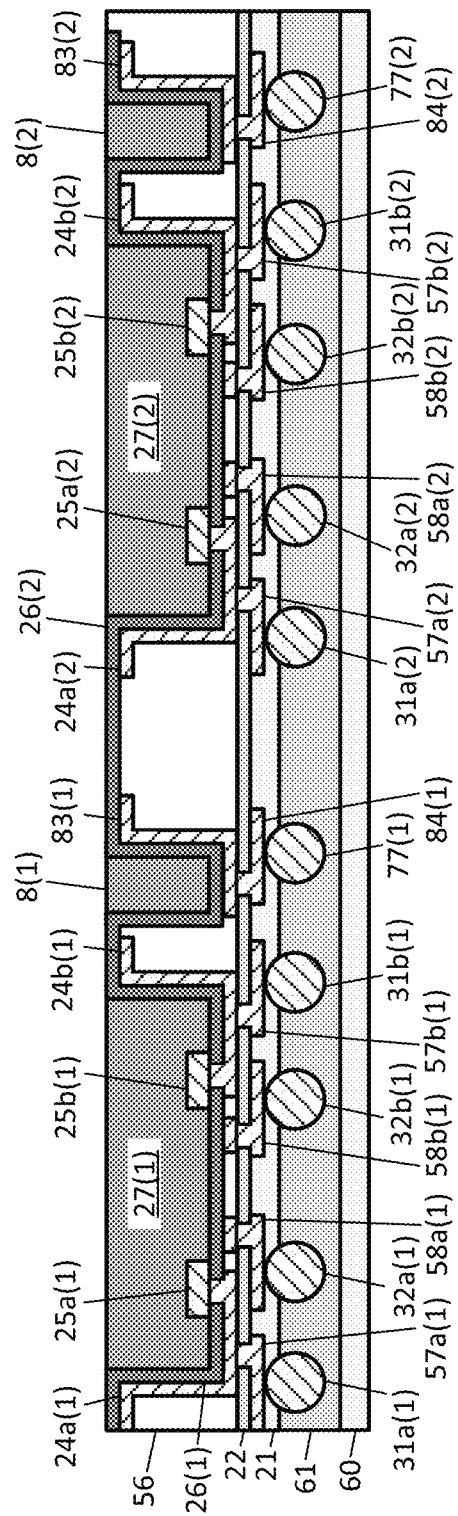
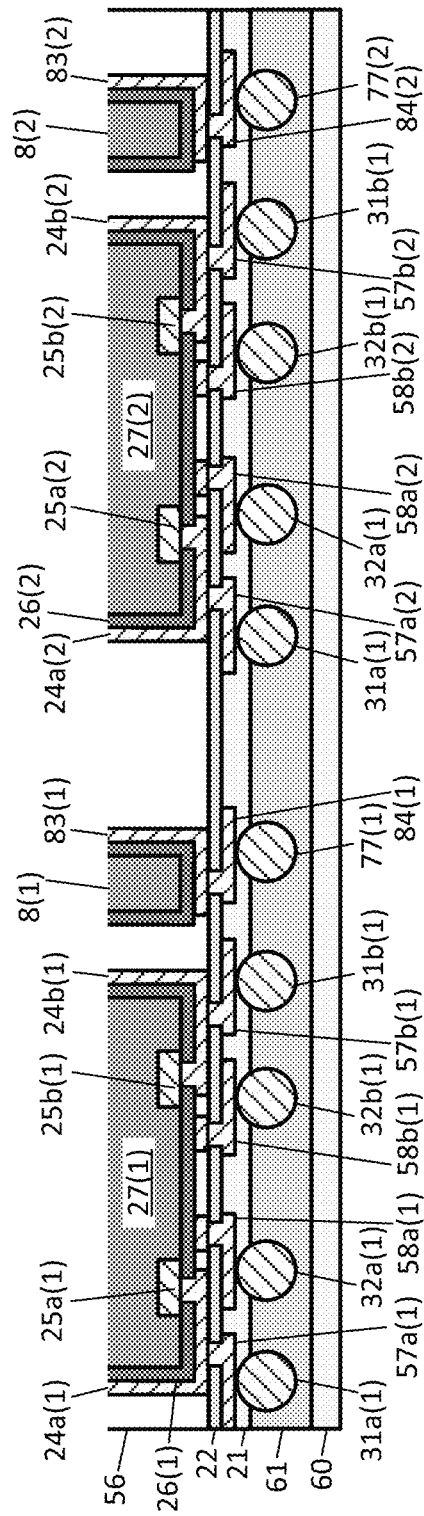
FIG. 5I
FIG. 5J

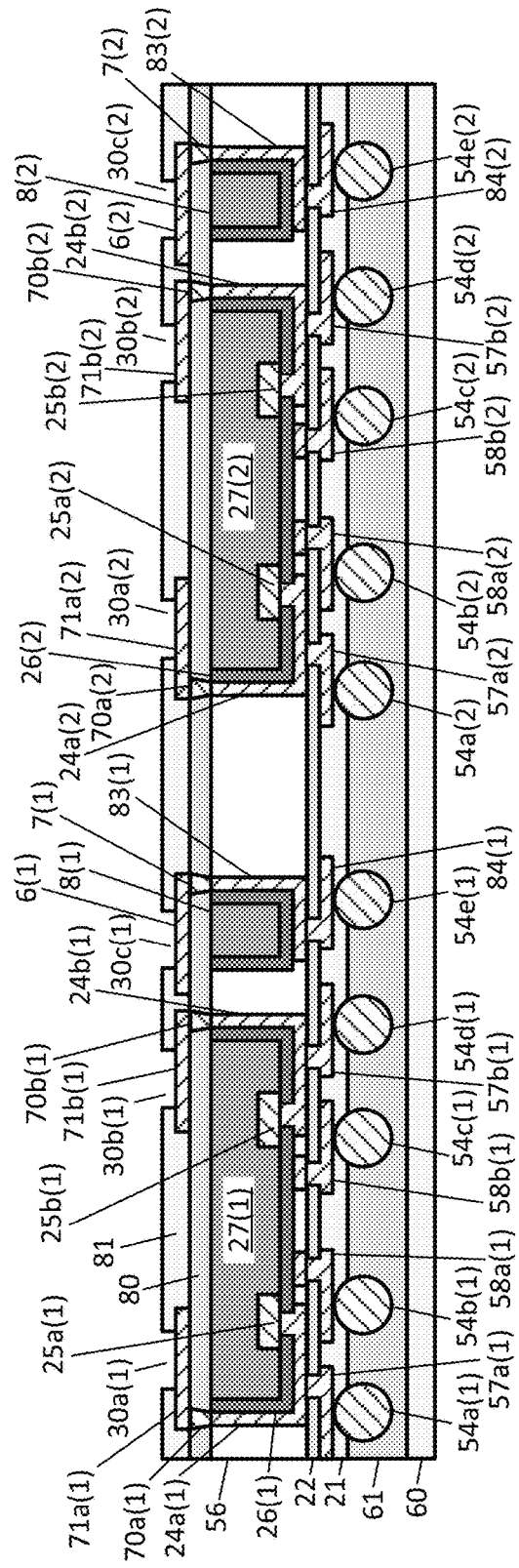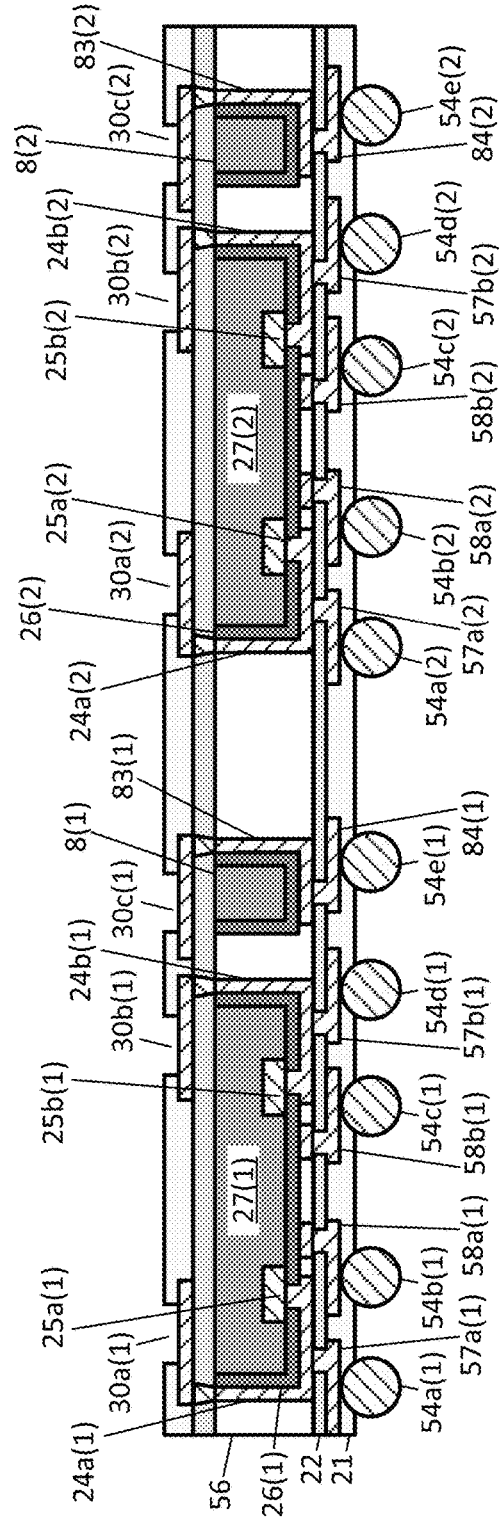
FIG. 5K
FIG. 5L

WAFER LEVEL PACKAGING HAVING REDISTRIBUTION LAYER FORMED UTILIZING LASER DIRECT STRUCTURING

RELATED APPLICATION

This application claims priority to U.S. Provisional Application for Patent No. 63/155,400, filed Mar. 2, 2021, the contents of which are incorporated by reference in their entirety.

TECHNICAL FIELD

This disclosure is related to techniques for forming wafer-level packages and, in particular, to forming wafer-level packages having redistribution layers formed using laser direct structuring so as to enable high density wafer-level packages, large size wafer-level packages, and high pin-count wafer-level packages.

BACKGROUND

Semiconductor die are packaged to protect the die from operating environments and to provide an electrical interface between a die and an electronic device in which the die is utilized. Traditionally, die packaging techniques were distinct from semiconductor manufacturing techniques used in wafer level processing. Recently, however, wafer level processing techniques have begun to be used in constructing the die packages.

FIG. 1 is a cross-sectional view of a known package 10 that includes a semiconductor die 14 having its back side and edge sides encapsulated by a resin encapsulation layer 16, with a passivation layer 12 extending on the front side of the semiconductor die 14 and front side of the encapsulation layer 16. A solder resist layer 11 is disposed on the front side of the passivation layer 12. A redistribution layer formed within the passivation layer 12 and solder resist layer 11 includes interconnections 13a and 13b respectively connected to pads (or pins) 15a and 15b at the front side of the semiconductor die 14.

The solder resist layer 11 has a plurality of recesses extending completely therethrough that receive solder balls 17a and 17b of a ball grid array that are respectively connected to interconnections 13a and 13b of the redistribution layer.

Semiconductor die packaged according to the wafer-level packaging techniques of the prior art such as in FIG. 1 have several limitations. For example, the cost of forming high density, large size, and high pin-count wafer-level packages may be higher than desirable, particularly when a fan-out arrangement is to be used. This has been exacerbated over time due to the fact that wafer technology has increased at a faster rate than packaging technology. As such, further development is needed.

SUMMARY

Disclosed herein is a method of forming a wafer-level package. The method involves: singulating a wafer into a plurality of reconstituted integrated circuit dies; affixing a carrier to a front side of the plurality of integrated circuit dies; forming a laser direct structuring (LDS) activatable resin over a back side of the plurality of integrated circuit dies, over side edges of the plurality of integrated circuit die, and over adjacent portions of the carrier; activating desired areas of the LDS activatable resin to form conductive areas within the LDS activatable resin, at least one of the conductive areas associated with each integrated circuit die being formed to contact a respective pad of that integrated circuit die and to run alongside to and in contact with a side of the LDS activatable resin in contact with a side edge of that integrated circuit die; and forming first conductive traces on the conductive areas formed within the LDS activatable resin by the activation.

The method may also include: depositing a molding layer over portions of the first conductive traces and the LDS activatable resin; depositing a first passivation layer over portions of the molding layer and the first conductive traces; forming second conductive traces extending along and through the first passivation layer to contact the first conductive traces; depositing a first solder resist layer on the second conductive traces and the first passivation layer; forming holes in the first solder resist layer adjacent to the second conductive traces to expose portions of the second conductive traces; and forming solder balls in the holes that contact the exposed portions of the second conductive traces.

The method may further include removing the carrier, flipping the plurality of integrated circuit dies, and affixing a new carrier to the back side of the plurality of integrated circuit dies.

As described herein, portions of the front side of the plurality of integrated circuit dies, the LDS activatable resin, the first conductive traces, and the molding layer may be ground away. In addition, a second passivation layer may be deposited over exposed portions of the front side of the plurality of integrated circuit dies, exposed portions of the LDS activatable resin, exposed portions of the first conductive traces, and exposed portions of the molding layer.

Third conductive traces extending along and through the second passivation layer to contact the first conductive traces may be formed.

A second solder resist may be deposited on the third conductive traces and the second passivation layer, and holes may be formed in the second solder resist to expose portions of the third conductive traces.

Another method disclosed herein involves: singulating a wafer into a plurality of reconstituted integrated circuit dies and a plurality of dummy pillars; affixing a carrier to a front side of the plurality of integrated circuit dies and the plurality of dummy pillars; forming a laser direct structuring (LDS) activatable resin over a back side of the plurality of integrated circuit dies, over side edges of the plurality of integrated circuit dies, over a back side of the plurality of dummy pillars, over side edges of the plurality of dummy pillars, and over adjacent portions of the carrier; activating desired areas of the LDS activatable resin to form conductive areas within the LDS activatable resin, at least one of the conductive areas associated with each integrated circuit die being formed to contact a respective pad of that integrated circuit die and to run alongside to and in contact with a side of the LDS activatable resin in contact with a side edge of that integrated circuit die, at least one of the conductive areas associated with each dummy pillar being formed to run alongside to and in contact with a side of the LDS activatable resin in contact with a side edge of that dummy pillar; and forming first conductive traces on the conductive areas formed within the LDS activatable resin by the activation.

This method may also involve: depositing a molding layer over portions of the first conductive traces and the LDS activatable resin; depositing a first passivation layer over portions of the molding layer and the first conductive traces; forming second conductive traces extending along and through the first passivation layer to contact the first conductive traces; depositing a first solder resist layer on the second conductive traces and the first passivation layer; forming holes in the first solder resist layer adjacent to the second conductive traces to expose portions of the second conductive traces; and forming solder balls in the holes that contact the exposed portions of the second conductive traces.

The method may also include removing the carrier, flipping the plurality of integrated circuit dies and plurality of dummy pillars, and affixing a new carrier to the back side of the plurality of integrated circuit dies and the back side of the plurality of dummy pillars.

Portions of the front side of the plurality of integrated circuit dies, the front side of the plurality of dummy pillars, the LDS activatable resin, the first conductive traces, and the molding layer may be ground away.

A second passivation layer may be deposited over exposed portions of the front side of the plurality of integrated circuit dies, the front side of the plurality of dummy pillars, exposed portions of the LDS activatable resin, exposed portions of the first conductive traces, and exposed portions of the molding layer.

Third conductive traces may be formed extending along and through the second passivation layer to contact the first conductive traces. In addition, a second solder resist may be deposited on the third conductive traces and the second passivation layer, and forming holes in the second solder resist to expose portions of the third conductive traces.

Also disclosed herein is a wafer-level package, including: an integrated circuit die having a plurality of pads on its front side; a resin layer surrounding edge sides of the integrated circuit die, and surrounding the front side of the integrated circuit die; wherein the resin layer includes an activatable catalyst material; a first passivation layer having its back surface in contact with a front surface of the resin layer adjacent to the front side of the integrated circuit die; a first solder resist layer having its back surface in contact with a front surface of the passivation layer; and a redistribution layer. The redistribution layer may include: first activated portions of the resin layer adjacent to the plurality of pads to form electrical connections extending from the plurality of pads to the back surface of the resin layer; second activated portions of the resin layer extending along the back surface of the resin layer toward portions of the resin layer surrounding the edge sides of the integrated circuit die; third activated portions of the resin layer extending along the portions of the resin layer surrounding the edge sides of the integrated circuit die; and a first interconnect structure extending from the second activated portions of the resin layer, through the first passivation layer, and through the first solder resist layer.

The redistribution layer may include solder balls respectively connected to the first interconnect structure at locations thereof extending through the first solder resist layer.

The redistribution layer may include: a second passivation layer having its front surface in contact with a back side of the integrated circuit die; a second solder resist layer having its front surface in contact with a back side of the second passivation layer; and a second interconnect structure extending from the third activated portions of the resin layer, through the second passivation layer, and through the second solder resist layer; wherein the second solder resist layer has openings defined therein exposing portions of the second interconnect structure.

A molding layer may be in contact with the first, second, and third activated portions of the resin layer, in contact with un-activated portions of the resin layer that surround the edge sides of the integrated circuit die, and in contact with un-activated portions of the resin layer that surround the front side of the integrated circuit die.

A dummy pillar may be spaced apart from the integrated circuit die, the first, second, and third activated portions of the resin layer, and the un-activated portions of the resin layer that surround the edge sides of the integrated circuit die. In addition, an additional resin layer may surround edge sides of the dummy pillar, and surround a front side of the dummy pillar. The first passivation may have its back surface in contact with a front surface of the additional resin layer. An additional redistribution layer may include: first activated portions of the additional resin layer adjacent to the front side of the dummy pillar; second activated portions of the additional resin layer extending along the back surface of the additional resin layer toward portions of the additional resin layer surrounding the edge sides of the dummy pillar; third activated portions of the additional resin layer extending along the portions of the additional resin layer surrounding the edge sides of the dummy pillar; and a third interconnect structure extending from the second activated portions of the additional resin layer, through the first passivation layer, and through the first solder resist layer.

The second passivation layer may also have its front surface in contact with the back side of the dummy pillar. A fourth interconnect structure may extend from the third activated portions of the additional resin layer, through the second passivation layer, and through the second solder resist layer, and the second solder resist layer may have openings defined therein exposing portions of the fourth interconnect structure.

BRIEF DESCRIPTION OF THE DRAWINGS

FIGS. 4A-4L illustrate the series of steps involved in fabricating the first wafer-level package of FIG. 2.

FIGS. 5A-5M illustrate the series of steps involved in fabricating the second wafer-level package of FIG. 3.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
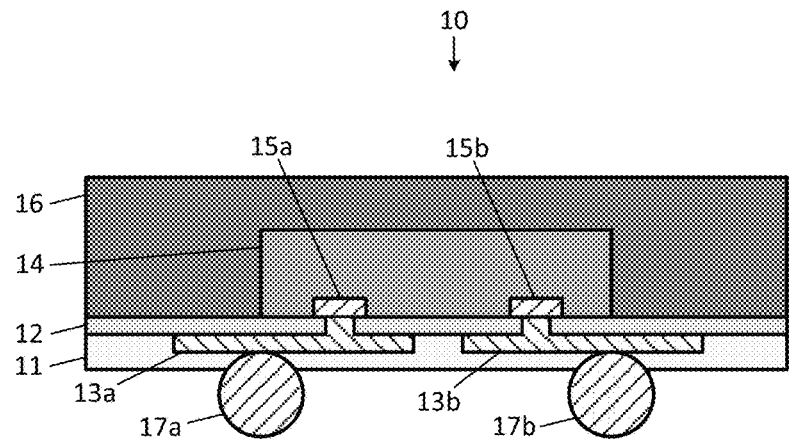
FIG. 1 is a cross sectional view of a wafer-level package formed using prior art techniques.
Figure 2:
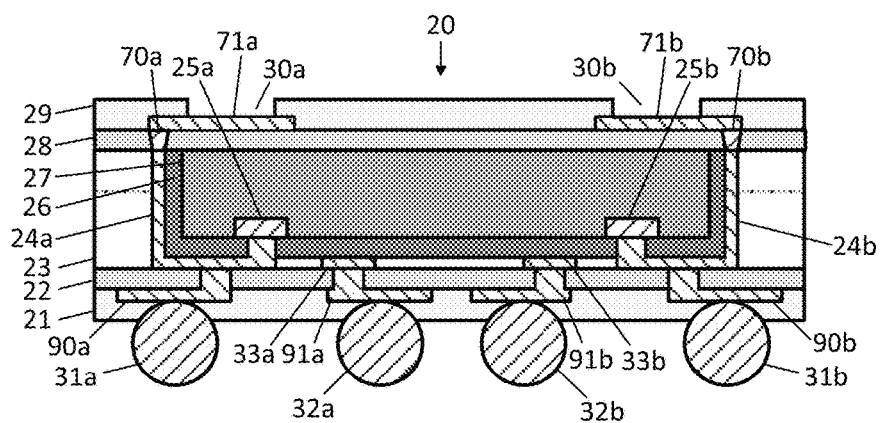
FIG. 2 is a cross sectional view of a first wafer-level package formed using techniques described herein.

With initial reference to FIG. 2, a first wafer-level package 20 is now described. The first wafer-level package 20 is comprised of a semiconductor die 27 having pads or pins 25a and 25b on its front side. A resin encapsulation 26 surrounds the edge sides of the semiconductor die 27, and further covers the front side of the semiconductor die 27 except at the locations where holes are formed therethrough for passage of conductors 24a and 24b from a redistribution layer (RDL) to reach pads 25a, 25b at the front side of the semiconductor die 27. Portions of a molding layer 23 are in contact with the front surface and side surfaces of the resin encapsulation 26 at locations where the RDL is not present.

The RDL is formed within the resin encapsulation 26, within the portions of the molding layer 23 in contact with the front surface of the resin encapsulation 26, within a passivation layer 22 having its back surface in contact with a front surface of the resin encapsulation 26 and its front surface in contact with a back surface of a solder resist layer 21, and within the solder resist layer 21 itself. In particular, the RDL includes conductors 24a and 24b that extend through the resin encapsulation 26 at the front surface to contact the pads 25a and 25b of the wafer 27, and that extend upward (through the molding layer 23) alongside with and in contact with the portions of the resin encapsulation 26 on the sides of the semiconductor die 27 to reach vias 70a and 70b. The RDL also includes conductors 90a and 90b that extend through the passivation layer 22 and into the solder resist layer 21 to contact solder balls 31a and 31b.

The vias 70a and 70b extend through a passivation layer 28 extending on the back surface of the semiconductor die 27 and on the back surfaces of the portions of the resin encapsulation 26 and molding layer 23 which are present adjacent the side edges of the semiconductor die 27, to contact conductive pads 71a and 71b extending along the back surface of the passivation layer 28. A back solder resist layer 29 extends along a front surface of the passivation layer 28, and has holes 30a and 30b defined therein to expose the conductive pads 71a and 71b.

The RDL also includes conductors 33a and 33b that contact pads (not shown) of the semiconductor die 27 and extend through the molding layer 23 to contact conductors 91a and 91b, which in turn extend through the passivation layer 22 and the solder resist layer 21 to contact solder balls 32a and 32b. The molding layer 23 surrounds the conductors 24a and 24b on their sides, and surrounds the sides of the resin encapsulation 26 on portions of the sides thereof where the conductors 24a and 24b are not present.

Of note here is that the conductors 24a, 24b and 33a, 33b are not vias, and are not formed by drilling and filling. As will be explained below in detail, the conductors 24a, 24b and 33a, 33b are formed by activating desired areas of the resin encapsulation 26, which contains an activatable catalyst, and then plating the activated areas.

Figure 3:
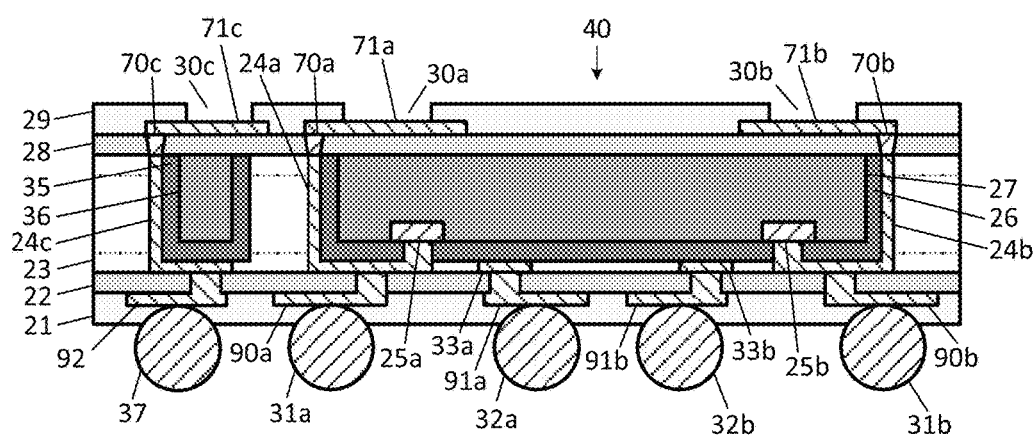
FIG. 3 is a cross sectional view of a second wafer-level package formed using techniques described herein.

Another embodiment, showing a second wafer-level package 40, is now described with reference to FIG. 3. Here, the structure is the same as the first wafer-level package 20, except there is an additional structure. Here, a dummy pillar 36 is surrounded on its sides by a resin encapsulation 35, and is surrounded on its front side by the resin encapsulation 35. Here, the RDL includes a conductor 24c extending along the back surface of the resin encapsulation 35, and upward (through the molding layer 23) alongside with and in contact with the portions of the resin encapsulation 35 on the side edges of the dummy pillar 36 to reach via 70c. The RDL here also includes a conductor 92 extending through the passivation layer 22 into the solder resist layer 21 to contact the solder ball 37. The via 70c extends through a passivation layer 28 on the back surface of the dummy pillar 36 to contact pad 71c. As stated, the solder resist layer 29 extends along the back surface of the passivation layer 28, and moreover, has a hole 30c defined therein to expose the conductive pad 71c. The molding layer 23 surrounds the conductor 24c on its side, and surrounds the surfaces of the resin encapsulation 25 on portions thereof where the conductor 24c is not present.

In this embodiment, not only are the conductors 24a, 24b and 33a, 33b not vias, and not formed by drilling and filling, but the conductor 24c is not a via and is not formed by drilling and filling. As will be explained below in detail, the conductors 24a, 24b, 24c and 33a, 33b are formed by activating desired areas of the resin encapsulation 26, which contains an activatable catalyst, and then plating the activated areas.

Figure 4E:
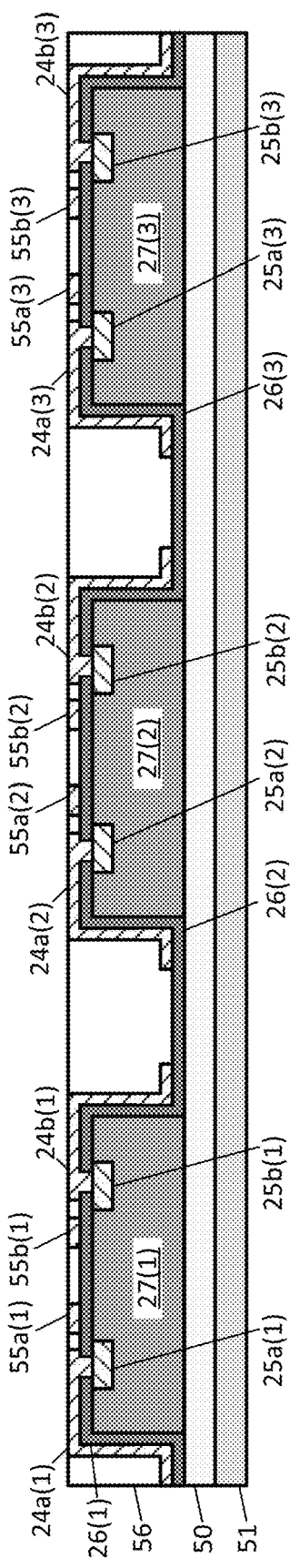

Formation of the first wafer-level package 20 is now described with reference to the series of drawings of FIGS. 4A-4L. Referring first to FIG. 4A, a single incoming wafer 9 is singulated using a saw blade or laser cutting tools into reconstituted die 27(1), 27(2), and 27(3) that have their back sides placed onto a tape layer 50 on a carrier 51, as shown in FIG. 4B, for example using a pick and place operation. The carrier 51 can be round or rectangular, with capacity for multiple die, and has a greater surface area than that of the die 27. The carrier 51 may be a temporary substrate containing a sacrificial base material, and the tape layer 50 acts as a temporary adhesive bonding film.

Note that while three reconstituted die 27(1), 27(2), and 27(3) are shown for brevity, in reality, there may be any number of reconstituted die, and the number of such die may be generally dependent upon the size of the wafer 9. Also note that in the descriptions below, the components and layers are the same on each die 27(1), 27(2), and 27(3), and are therefore described but once. Moreover, in the drawings, such components and layers have a parenthetical (1), (2), or (3) appended thereto indicating to which die they belong, but in the descriptions below, will be described without the parentheticals for ease of reading and because such components and layers are the same for each die.

Continuing now with the description, each reconstituted die 27 has pads or pins 25a and 25b formed on a front side of the die, and is sprayed on its front side and edge sides with a laser direct structuring (LDS) compatible resin 26, as shown in FIG. 4C. The resin encapsulation layer 26, as sprayed, is infused or implanted with a laser-activated catalyst or particles that become conductive when exposed to certain laser radiation, such as infrared (IR) laser radiation. For example, the resin encapsulation layer 26 may include particles such as copper-chromium oxide spinel, copper sulfate, copper hydroxide phosphate, or cupric rhodanate, embedded within the insulating layer.

The resin encapsulation layer 26 is then cured, ending up with a thickness of 15 to 25 microns. Thereafter, laser light is used to form a desired pattern of conductive traces in the resin encapsulation layer 26 by activating the catalyst in the desired portions of the resin encapsulation layer 26 to make those portions conductive. For, example, laser activation can be applied at the locations along the front side and edge sides of the layer 26 where portions of the RDL is desired. Then, a plating or deposition process, such as sputtering, electrolytic plating, or electroless plating, is used to form an electrically conductive layer on the resin encapsulation layer 26, comprised of the conductors 24a, 24b, 55a, and 55b as shown in FIG. 4D. The conductor 24a makes contact with pad 25a on the semiconductor die 27 and runs across the front surface of the resin encapsulation layer 26 to form the illustrated shape. Similarly, the conductor 24b makes contact with pad 25b on the semiconductor die 27 and runs across the front surface of the encapsulation layer 26 to form the illustrated shape.

The portions of the conductors 24a and 24b that extend through the resin 26 to contact the pads 25a and 25b are actually vias, formed by laser drilling and LDS activation of the material in the walls of the holes formed by laser drilling, followed by plating.

Figure 4F:
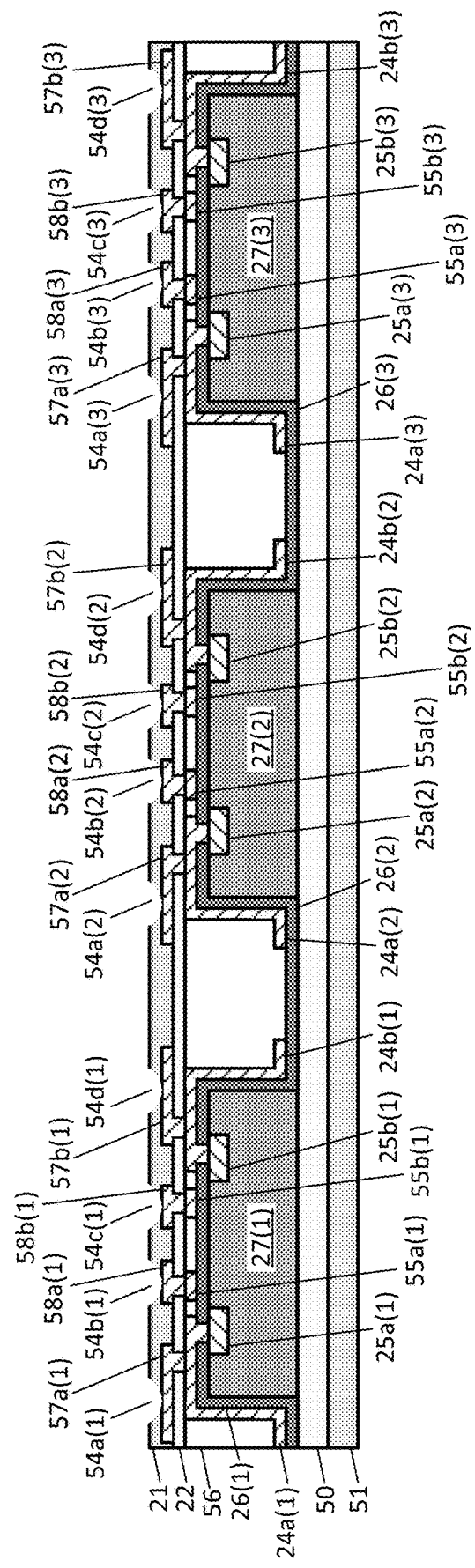
Figure 4G:
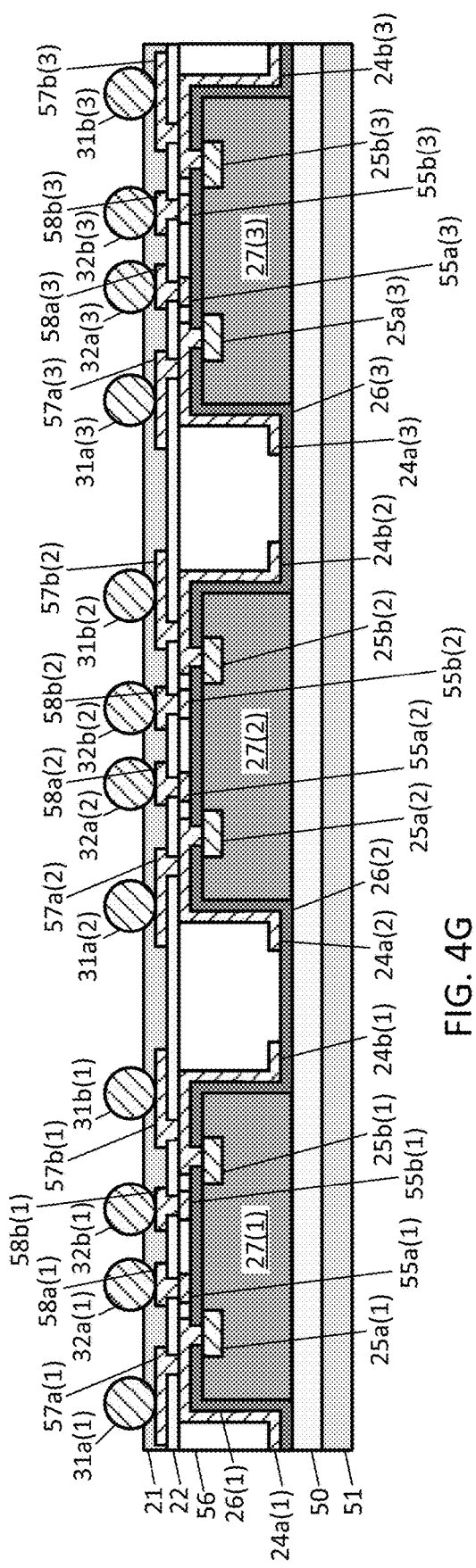

A molding layer 56 is then conformally deposited over the conductors 24a, 24b, 55a, and 55b and the resin encapsulation layer 26, and polished to form a flat surface, as shown in FIG. 4E. Thereafter, a passivation layer 22 is deposited over the conductors 24a and 24b and the molding layer 56, for example, using plasma vapor deposition, chemical vapor deposition, printing, lamination, spin coating, or spray coating techniques, as shown in FIG. 4F. Holes are formed in the passivation layer 22, and conductors 57a, 57b, 58a, and 58b are formed (without using LDS techniques, but instead by conventional drilling and patterning) on the passivation layer 22 and extending through the holes to make contact with the conductors 24a, 24b, 58a, and 58b, as also shown in FIG. 4F, completing the formation of the front side redistribution layer (RDL).

Thereafter, a solder resist layer 21 is deposited over the passivation layer 22 and the conductors 57a, 57b, 58a, and 58b, also shown in FIG. 4F, and then holes 54a, 54b, 54c, and 54d are formed in the solder resist layer 21, for example by a patterning and etching process. Solder balls 31a, 31b, 32a, and 32b are then formed in the holes 54a, 54b, 54c, and 54d to make contact with the conductors 57a, 57b, 58a, and 58b, shown in FIG. 4G.

Figure 4H:
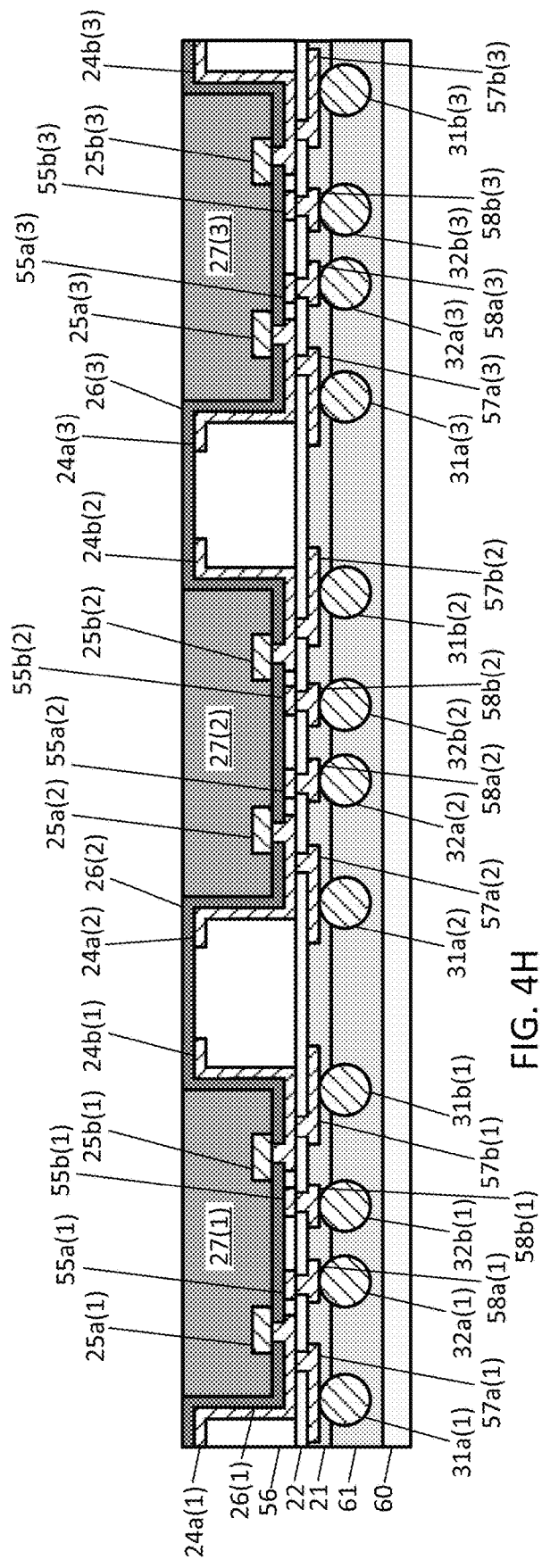

The formed wafer is then separated from the tape 50 and carrier 51, flipped over, and placed onto a new tape 61 and carrier 60, as shown in FIG. 4H. A back grinding operation is then performed, as shown in FIG. 4I, exposing the back surface of the die 27, as well as portions of the resin encapsulation layer 26 abutting the sides of the die 27, portions of the conductors 24a and 24b abutting the resin encapsulation layer 26, and portions of the molding layer 56 abutting the conductors 24a and 24b.

Next, a passivation layer 80 is deposited over the back surfaces of the die 27, the resin encapsulation layer 26, the conductors 24a and 24b, and the molding layer 56, for example, using plasma vapor deposition, chemical vapor deposition, printing, lamination, spin coating, or spray coating techniques, as shown in FIG. 4J. Holes are formed in the passivation layer 80, and conductors 70a, 70b, 71a, and 71b are formed on the passivation layer 80 and extending through the holes to make contact with the conductors 24a and 24b. Thereafter, a solder resist layer 81 is deposited over the passivation layer 80 and the conductors 71a and 71b, and then holes 30a and 30b are formed in the solder resist layer 81, for example by a patterning and etching process, to expose the conductors 71a and 71b, completing the formation of the back side redistribution layer (RDL).

The tape 61 and carrier 60 are then removed, as shown in FIG. 4K. The die 27 are then singulated through the solder resist 81, passivation layer 80, molding layer 56, passivation layer 22, and solder resist layer 21 with a saw blade or laser cutting tool into individual wafer level packages 20(1), 20(2), and 20(3), as shown in FIG. 4L.

Figure 5A:
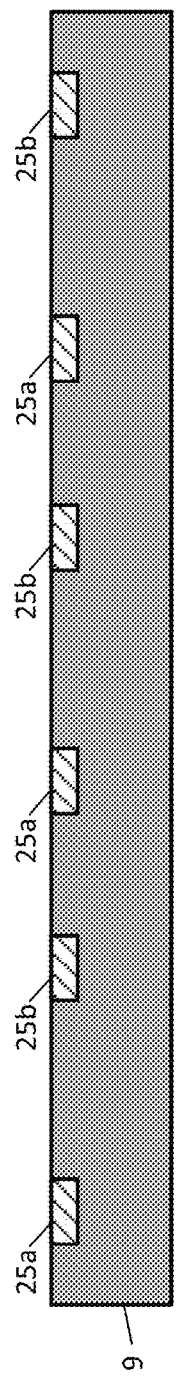
Figure 5B:
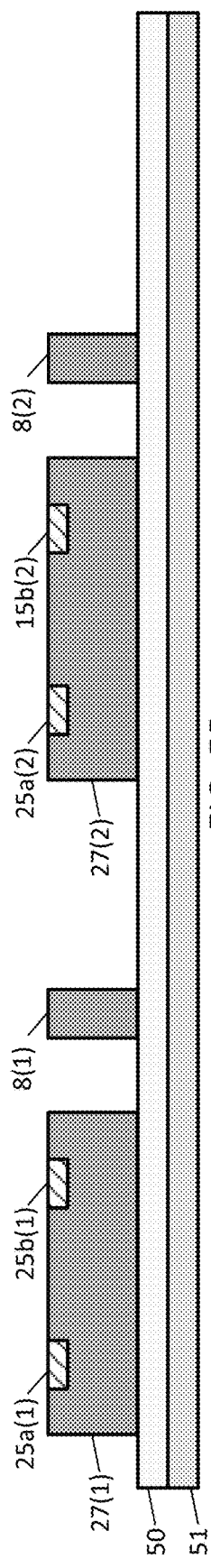

Formation of the second embodiment of the wafer-level package 20 is now described with reference to the series of drawing FIGS. 5A-5N. Referring first to FIG. 5A, a single incoming wafer 9 is singulated using a saw blade or laser cutting tools into reconstituted die 27(1) and 27(2) as well as dummy pillars 8(1) and 8(2) that are placed onto a tape layer 50 on a carrier 51, as shown in FIG. 5B, for example using a pick and place operation. The carrier 51 can be round or rectangular, with capacity for multiple die, and has a greater surface area than that of the die 27. The carrier 51 may be a temporary substrate containing a sacrificial base material, and the tape layer 50 acts as a temporary adhesive bonding film.

Note that while two reconstituted die 27(1) and 27(2), as well as two dummy pillars 8(1) and 8(2) are shown for brevity, in reality, there may be any number of reconstituted die, and the number of such die may be generally dependent upon the size of the wafer 9. Also note that in the descriptions below, the components and layers are the same on each die 27(1) and 27(2), as well as on each dummy pillar 8(1) and 8(2), and are therefore described but once. Moreover, in the drawings, such components and layers have a parenthetical (1) or (2) appended thereto indicating to which die they belong, but in the descriptions below, will be described without the parentheticals for ease of reading and because such components and layers are the same for each die.

Figure 5C:
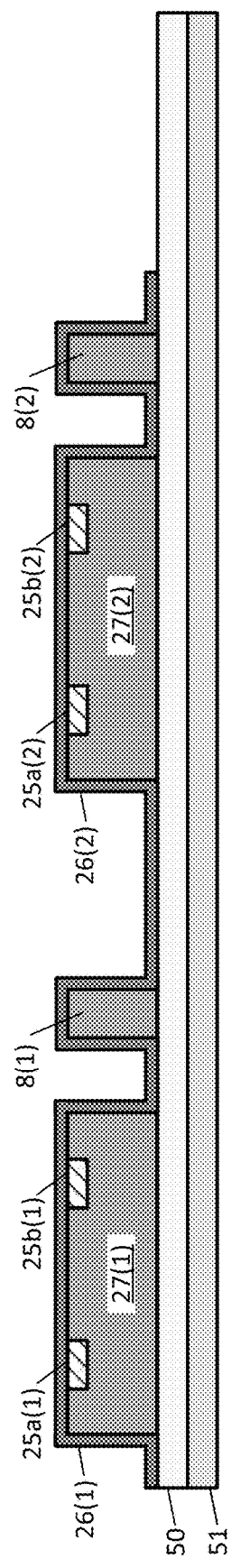

Continuing now with the description, each reconstituted die 27 has pads or pins 25a and 25b formed thereon. Each reconstituted die 27 and dummy pillar 8 is sprayed on its front side and edge sides with a laser direct structuring (LDS) compatible resin 26, as shown in FIG. 5C. The resin encapsulation layer 26, as sprayed, is infused or implanted with a laser-activated catalyst or particles that become conductive when exposed to certain laser radiation, such as infrared (IR) laser radiation. For example, the resin encapsulation layer 26 may include particles such as copper-chromium oxide spinel, copper sulfate, copper hydroxide phosphate, or cupric rhodanate, embedded within the insulating layer.

Figure 5D:
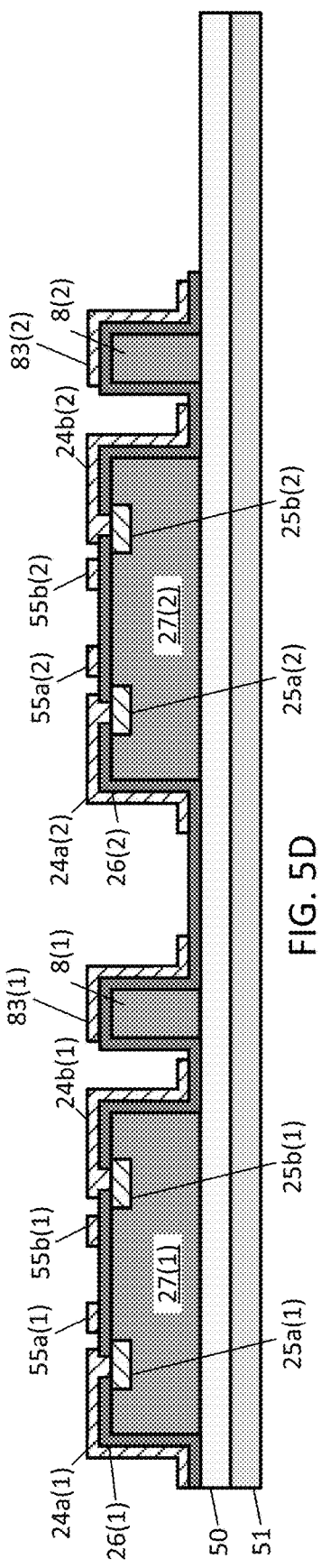

The resin encapsulation layer 26 is then cured, ending up with a thickness of 15 to 25 microns. Thereafter, laser light is used to form a desired pattern of conductive traces in the resin encapsulation layer 26 by activating the catalyst in the desired portions of the resin encapsulation layer 26 to make those portions conductive. For example, laser activation can be applied at the locations along the front side and edge sides of the layer 26 where portions of the RDL are desired. Then, a plating or deposition process, such as sputtering, electrolytic plating, or electroless plating, is used to form an electrically conductive layer on the resin encapsulation layer 26, comprised of the conductors 24a, 24b, 55a, 55b, and 83 as shown in FIG. 5D. The conductor 24a makes contact with pad 25a on the semiconductor die 27 and runs across the front surface of the resin encapsulation layer 26 to form the illustrated shape. Similarly, the conductor 24b makes contact with pad 25b on the semiconductor die 27 and runs across the front surface of the encapsulation layer 26 to form the illustrated shape. Likewise, conductor 83 runs across the back surface of the encapsulation layer 26 on the dummy pillar 8 to form the illustrated shape.

Figure 5E:
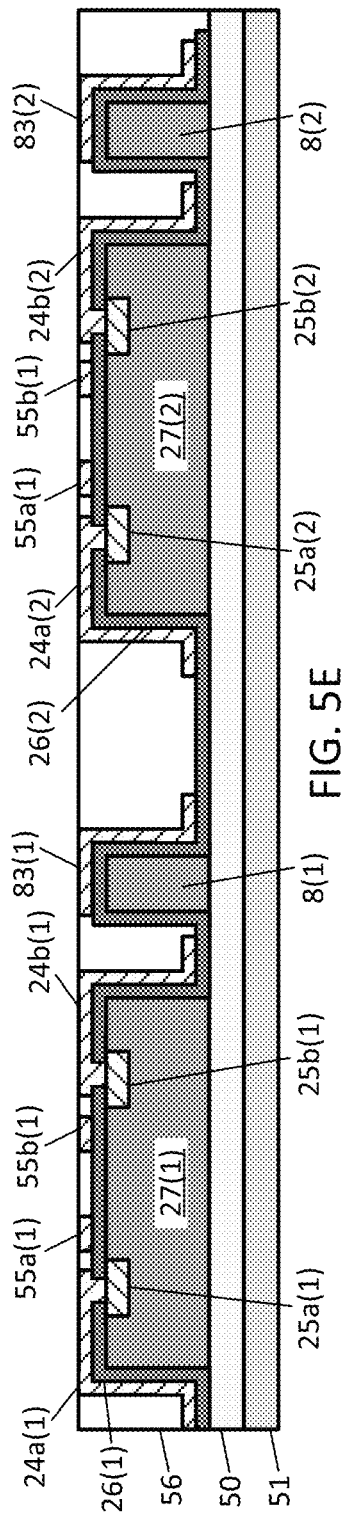
Figure 5F:
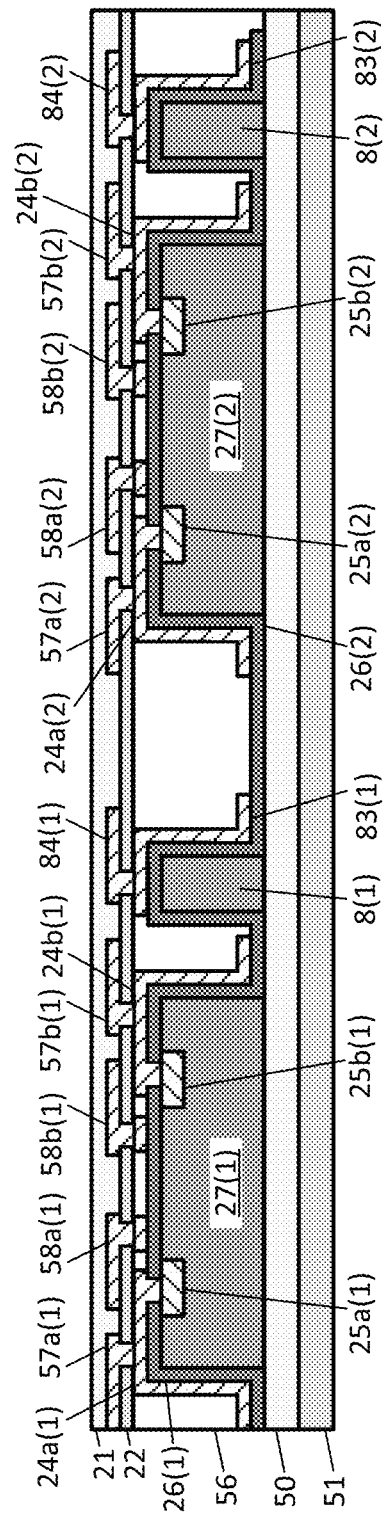

A molding layer 56 is then conformally deposited over the conductors 24a and 24b, 55a and 55b, 83, and the resin encapsulation layer 26, and polished to form a flat surface, as shown in FIG. 5E. Thereafter, a passivation layer 22 is deposited over the conductors 24a and 24b, 55a and 55b, and 83 and the molding layer 56, for example, using plasma vapor deposition, chemical vapor deposition, printing, lamination, spin coating, or spray coating techniques, as shown in FIG. 5F. Holes are formed in the passivation layer 22, and conductors 57a, 57b, 58a, 58b, and 84 are formed on the passivation layer 22 and extending through the holes to make contact with the conductors 24a, 24b, 58a, 58b, and 83 as also shown in FIG. 5F, completing the formation of the front side redistribution layer (RDL).

Figure 5G:
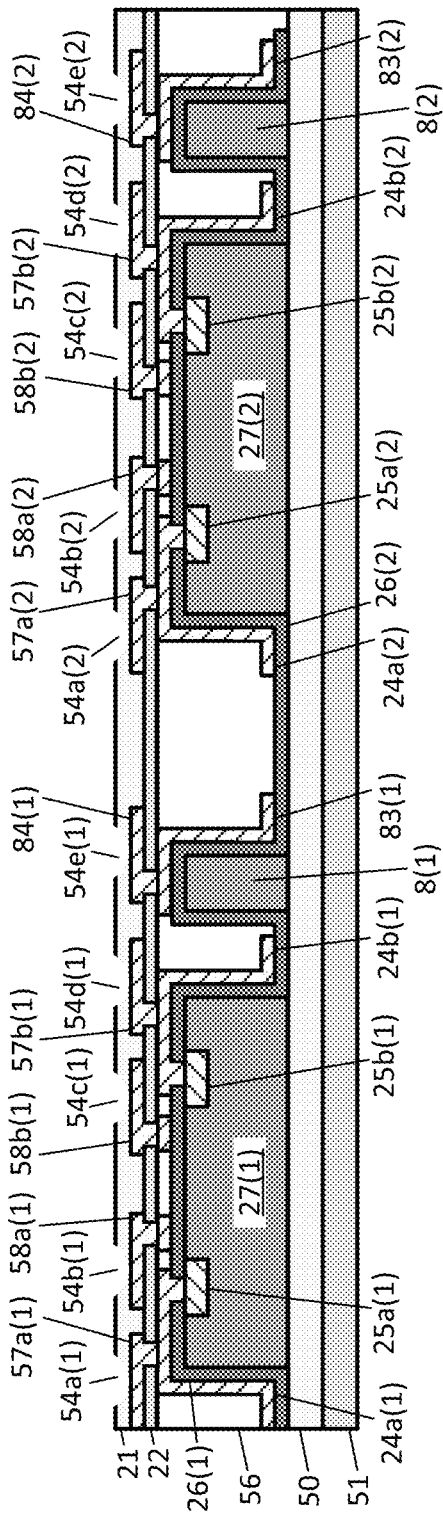
Figure 5H:
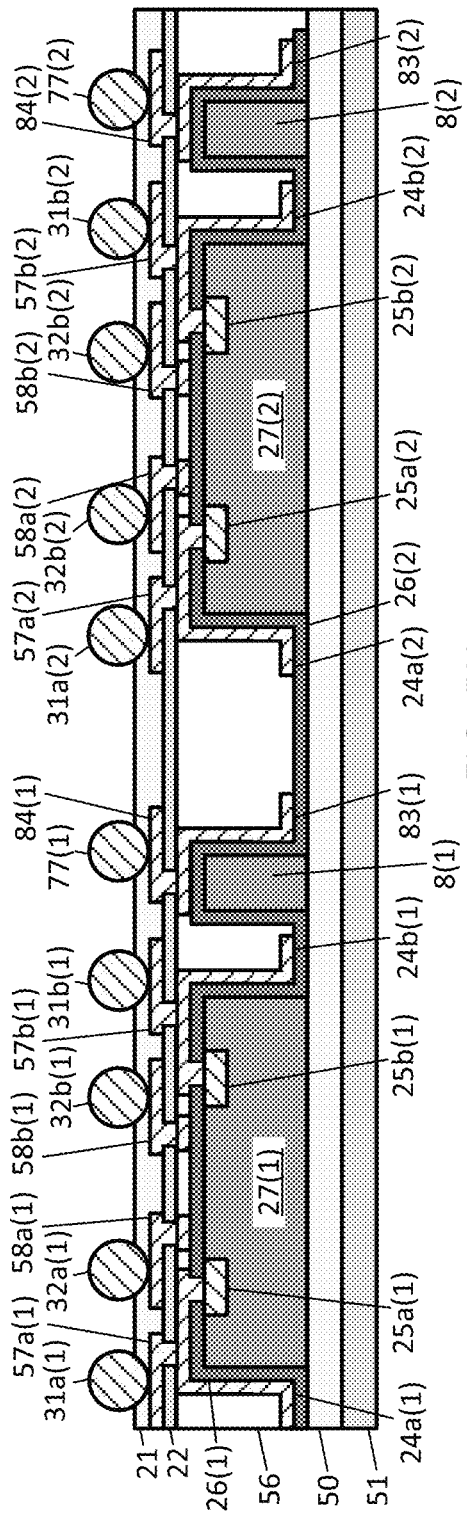

Thereafter, a solder resist layer 21 is deposited over the passivation layer 22 and the conductors 57a, 57b, 58a, 58b, and 84 also shown in FIG. 5F, and then holes 54a, 54b, 54c, 54d, and 54e are formed in the solder resist layer 21, for example by a patterning and etching process, as shown in FIG. 5G. Solder balls 31a, 31b, 32a, 32b, and 77 are then formed in the holes 54a, 54b, 54c, 54d, and 54e to make contact with the conductors 57a, 57b, 58a, 58b, and 84 shown in FIG. 5H.

The formed packages are then separated from the tape 50 and carrier 51, flipped over, and placed onto a new tape 61 and carrier 60, as shown in FIG. 5I A back grinding operation is then performed, as shown in FIG. 5J, exposing the back surface of the die 27 and dummy pillar 8, as well as portions of the resin encapsulation layer 26 abutting the sides of the die 27 and dummy pillar 8, portions of the conductors 24a, 24b, and 83 abutting the resin encapsulation layer 26, and portions of the molding layer 56 abutting the conductors 24a, 24b, and 83 together with portions of the resin encapsulation layer 26

Next, a passivation layer 80 is deposited over the back surfaces of the die 27, the resin encapsulation layer 26, the conductors 24a, 24b, and 83, and the molding layer 56, for example, using plasma vapor deposition, chemical vapor deposition, printing, lamination, spin coating, or spray coating techniques, as shown in FIG. 5K. Holes are formed in the passivation layer 80, and conductors 70a, 70b, 71a, 71b, 7, and 6 are formed on the passivation layer 80 and extending through the holes to make contact with the conductors 24a, 24b, and 83. Thereafter, a solder resist layer 81 is deposited over the passivation layer 80 and the conductors 71a, 71b, and 6, and then holes 30a, 30b, and 30c are formed in the solder resist layer 81, for example by a patterning and etching process, to expose the conductors 71a, 71b, and 6 completing the formation of the back side redistribution layer (RDL).

Figure 5M:
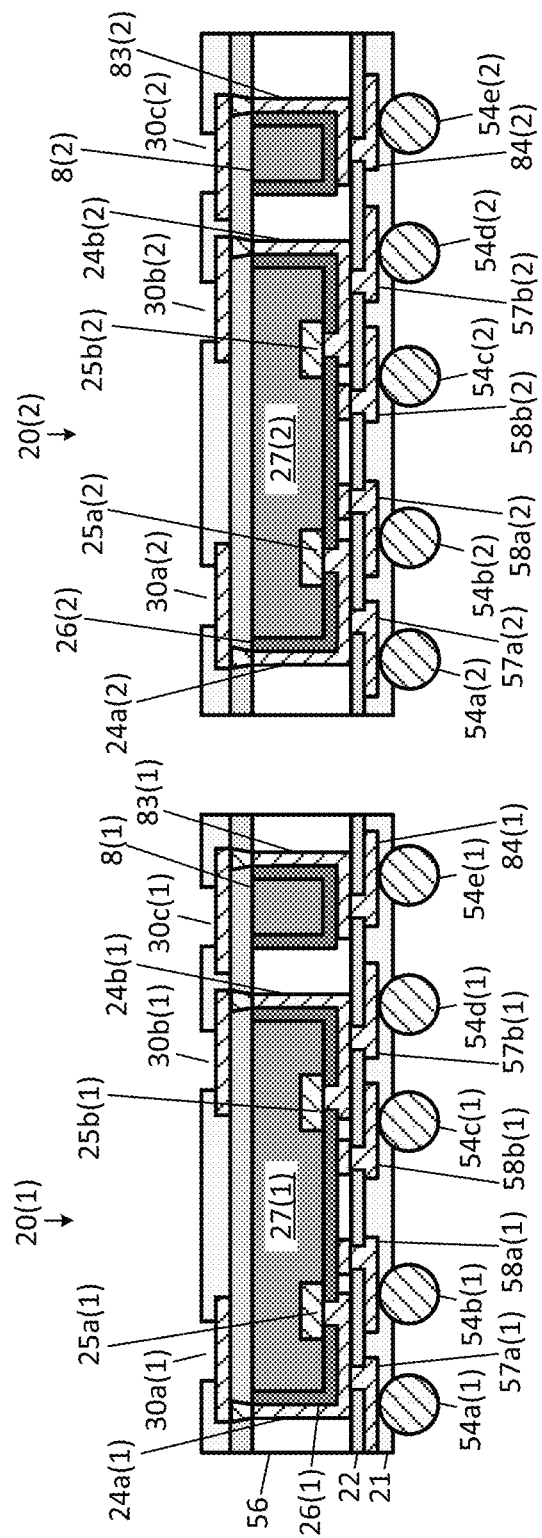

The tape 61 and carrier 60 are then removed, as shown in FIG. 5L. The die 27 are then singulated through the solder resist 81, passivation layer 80, molding layer 56, passivation layer 22, and solder resist layer 21 with a saw blade or laser cutting tool into individual wafer level packages 20(1), 20(2), and 20(3), as shown in FIG. 5M.

The techniques described herein can be used to form fan-out wafer-level packages and fan-in wafer-level packages. Indeed, these techniques allow for the formation of wafer-level packages at a reduced cost and complexity due to the use of the LDS resin to form the basis of the RDL, eliminating the need for more expensive and time consuming steps.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of forming a wafer-level package, the method comprising:
singulating a wafer into a plurality of reconstituted integrated circuit dies;
affixing a carrier to a back side of the plurality of reconstituted integrated circuit dies;
spraying a laser direct structuring (LDS) activatable resin over front and side edges of the plurality of reconstituted integrated circuit dies, and over adjacent portions of the carrier;
activating desired areas of the LDS activatable resin to form conductive areas within the LDS activatable resin, at least one of the conductive areas associated with each reconstituted integrated circuit die being formed to contact a respective pad of that reconstituted integrated circuit die and to run alongside to and in contact with a side of the LDS activatable resin in contact with a side edge of that reconstituted integrated circuit die;
forming first conductive traces on the conductive areas formed within the LDS activatable resin by the activation;
depositing a molding layer over portions of the first conductive traces and the LDS activatable resin;
depositing a first passivation layer over portions of the molding layer and the first conductive traces;
forming through-holes in the first passivation layer;
forming second conductive traces as copper pillars inside the through-holes and extending therethrough to contact the first conductive traces, using a non-LDS patterning process.

2. The method of claim 1, further comprising:
depositing a first solder resist layer on the second conductive traces and the first passivation layer;
forming holes in the first solder resist layer adjacent the second conductive traces to expose portions of the second conductive traces; and
forming solder balls in the holes that contact the exposed portions of the second conductive traces.

3. The method of claim 2, further comprising removing the carrier, flipping the plurality of reconstituted integrated circuit dies, and affixing a new carrier to the back side of the plurality of reconstituted integrated circuit dies.

4. The method of claim 3, further comprising grinding away portions of the front side of the plurality of reconstituted integrated circuit dies, the LDS activatable resin, the first conductive traces, and the molding layer.

5. The method of claim 4, further comprising depositing a second passivation layer over exposed portions of the front side of the plurality of reconstituted integrated circuit dies, exposed portions of the LDS activatable resin, exposed portions of the first conductive traces, and exposed portions of the molding layer.

6. The method of claim 5, further comprising forming third conductive traces extending along and through the second passivation layer to contact the first conductive traces.

7. The method of claim 6, further comprising depositing a second solder resist on the third conductive traces and the second passivation layer, and forming holes in the second solder resist to expose portions of the third conductive traces.

8. A method of forming a wafer-level package, the method comprising:
singulating a wafer into a plurality of reconstituted integrated circuit dies and a plurality of dummy pillars;
affixing a carrier to a back side of the plurality of reconstituted integrated circuit dies and the plurality of dummy pillars;
spraying a laser direct structuring (LDS) activatable resin over front and side edges of the plurality of reconstituted integrated circuit dies, over front and side edges of the plurality of dummy and over adjacent portions of the carrier;
activating desired areas of the LDS activatable resin to form conductive areas within the LDS activatable resin, at least one of the conductive areas associated with each reconstituted integrated circuit die being formed to contact a respective pad of that reconstituted integrated circuit die and to run alongside to and in contact with a side of the LDS activatable resin in contact with a side edge of that reconstituted integrated circuit die, at least one of the conductive areas associated with each dummy pillar being formed to run alongside to and in contact with a side of the LDS activatable resin in contact with a side edge of that dummy pillar;

forming first conductive traces on the conductive areas formed within the LDS activatable resin by the activation;

depositing a molding layer over portions of the first conductive traces and the LDS activatable resin;

depositing a first passivation layer over portions of the molding layer and the first conductive traces;

forming through-holes in the first passivation layer; and forming second conductive traces as copper pillars inside the through-holes and extending therethrough to contact the first conductive traces, using a non-LDS patterning process.

9. The method of claim 8, further comprising:

depositing a first solder resist layer on the second conductive traces and the first passivation layer;

forming holes in the first solder resist layer adjacent the second conductive traces to expose portions of the second conductive traces; and forming solder balls in the holes that contact the exposed portions of the second conductive traces.

10. The method of claim 9, further comprising removing the carrier, flipping the plurality of reconstituted integrated circuit dies and plurality of dummy pillars, and affixing a new carrier to the back side of the plurality of reconstituted integrated circuit dies and the back side of the plurality of dummy pillars.

11. The method of claim 10, further comprising grinding away portions of the front side of the plurality of reconstituted integrated circuit dies, the front side of the plurality of dummy pillars, the LDS activatable resin, the first conductive traces, and the molding layer.

12. The method of claim 11, further comprising depositing a second passivation layer over exposed portions of the front side of the plurality of reconstituted integrated circuit dies, the front side of the plurality of dummy pillars, exposed portions of the LDS activatable resin, exposed portions of the first conductive traces, and exposed portions of the molding layer.

13. The method of claim 12, further comprising forming third conductive traces extending along and through the second passivation layer to contact the first conductive traces.

14. The method of claim 13, further comprising depositing a second solder resist on the third conductive traces and the second passivation layer, and forming holes in the second solder resist to expose portions of the third conductive traces.

15. A method of forming a wafer-level package, the method comprising:

(a) providing a reconstituted wafer that includes a plurality of integrated circuit dies, each integrated circuit die having a front side that includes at least one die pad;

(b) spraying a laser direct structuring (LDS) activatable resin encapsulation layer over a front side and side edges of the plurality of integrated circuit dies, the LDS activatable resin encapsulation layer comprising an activatable catalyst;

(c) selectively irradiating one or more regions of the LDS activatable resin encapsulation layer with laser radiation to activate the catalyst in the one or more regions to thereby form one or more laser-activated regions of the LDS activatable resin encapsulation layer;

(d) plating the one or more laser-activated regions of the LDS activatable resin encapsulation layer to form a plurality of conductors, at least one of the plurality of conductors for each integrated circuit die contacting the at least one die pad of that integrated circuit die and extending alongside a side edge of that integrated circuit die;

(e) forming at least one passivation layer over the LDS activatable resin encapsulation layer and over at least a portion of the plurality of conductors;

(f) forming through-holes in the at least one passivation layer after the passivation layer is deposited;

(g) forming second conductive traces as copper pillars inside the through-holes and extending therethrough to contact the plurality of conductors, using a non-LDS patterning process.

16. The method of claim 15, further comprising depositing a molding layer over at least some of the plurality of conductors and over at least some of the LDS activatable resin encapsulation layer, and planarizing the molding layer to produce a substantially flat surface, prior to step (e).

17. The method of claim 16, further comprising:

depositing a first solder resist layer over the at least one passivation layer and over at least some of the plurality of conductors;

forming at least one opening in the first solder resist layer to expose a portion of at least one of the plurality of conductors; and attaching a solder ball in the at least one opening so as to make electrical contact with the exposed portion of the at least one conductor.

18. The method of claim 17, further comprising:

removing a first carrier on which the plurality of integrated circuit dies was supported;

reorienting and affixing a second carrier to an opposite side of the plurality of integrated circuit dies; and performing a back-grinding operation to expose back surfaces of the plurality of integrated circuit dies and at least portions of the LDS activatable resin encapsulation layer.

19. The method of claim 18, further comprising depositing a second passivation layer onto the exposed back surfaces of the plurality of integrated circuit dies, onto the exposed portions of the LDS activatable resin encapsulation layer, and onto any exposed portions of the molding layer, and forming second conductive traces along the second passivation layer so as to contact at least some of the plurality of conductors plated in step (d) of claim 15.

20. The method of claim 19, further comprising:

depositing a second solder resist layer over the second passivation layer and the second conductive traces; and forming openings in the second solder resist layer to expose portions of the second conductive traces.

21. The method of claim 20, further comprising singulating the reconstituted wafer through the second solder resist layer, the second passivation layer, the molding layer, and the first solder resist layer so as to produce individual wafer-level packages.

22. The method of claim 15, wherein the reconstituted wafer further comprises at least one dummy pillar, and wherein step (c) comprises selectively irradiating a portion of the LDS activatable resin encapsulation layer surrounding a side edge of the at least one dummy pillar so as to form at least one conductor along the side of the at least one dummy pillar.

23. The method of claim 22, further comprising, after singulating the wafer-level packages, attaching a solder ball to the at least one conductor formed along the side of the at least one dummy pillar to enable an external electrical connection through the at least one dummy pillar.

24. The method of claim 15, wherein the LDS activatable resin encapsulation layer has a post-cure thickness ranging from about 15 microns to about 25 microns.

* * * * *